(12) United States Patent
Chang et al.

(10) Patent No.: US 9,589,969 B1
(45) Date of Patent: Mar. 7, 2017

(54) SEMICONDUCTOR DEVICE AND MANUFACTURING METHOD OF THE SAME

(71) Applicant: Taiwan Semiconductor Manufacturing Co., Ltd., Hsinchu (TW)

(72) Inventors: Yu-Wei Chang, Hsinchu (TW); Austin Hsu, New Taipei (TW); Kung-Wei Lee, New Taipei (TW); Chui-Ya Peng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/996,233

(22) Filed: Jan. 15, 2016

(51) Int. Cl.
| H01L 29/788 | (2006.01) |
| H01L 27/112 | (2006.01) |
| H01L 21/48 | (2006.01) |
| H01L 23/525 | (2006.01) |

(52) U.S. Cl.
CPC ...... H01L 27/11206 (2013.01); H01L 21/485 (2013.01); H01L 23/5258 (2013.01)

(58) Field of Classification Search
CPC ............. H01L 27/11206; H01L 21/485; H01L 2224/83889; H01L 2224/11526; H01L 2221/68372; H01L 23/5258
See application file for complete search history.

(56) References Cited

U.S. PATENT DOCUMENTS

2009/0242948 A1* 10/2009 Barrett .............. H01L 27/14685
257/291
2011/0159632 A1* 6/2011 Sueyoshi .............. C23C 16/345
438/72
2011/0297955 A1* 12/2011 Wang ...................... H01L 33/24
257/76

* cited by examiner

*Primary Examiner* — Yosef Gebreyesus
(74) *Attorney, Agent, or Firm* — Jianq Chyun IP Office

(57) ABSTRACT

Semiconductor devices and manufacturing methods of the same are disclosed. The semiconductor device includes a die, a conductive structure, a bonding pad and a passivation layer. The conductive structure is over and electrically connected to the die. The bonding pad is over and electrically connected to the conductive structure. The passivation layer is over the bonding pad, wherein the passivation layer includes a nitride-based layer with a refractive index of about 2.16 to 2.18.

20 Claims, 6 Drawing Sheets

US 9,589,969 B1

SEMICONDUCTOR DEVICE AND MANUFACTURING METHOD OF THE SAME

BACKGROUND

Non-volatile memories are used in a wide array of applications as it has the ability to retain information in the absence of power and are used as long-term persistent storage. Examples of non-volatile memories include, but are not limited to, read only memories ("ROMs") such as programmable ROMs ("PROMs"), erasable PROMs ("EPROMs"), and electrically erasable PROMs ("EE-PROMs"). Another example of a non-volatile memory is ultraviolet-erase ("UV-erase") PROMs. In UV-erase PROMs, data can be erased by applying ultraviolet rays to the memory device to excite the electrons stored in the gate, thereby emitting the electrons from the gate to an external region.

DETAILED DESCRIPTION

Figure 1A:
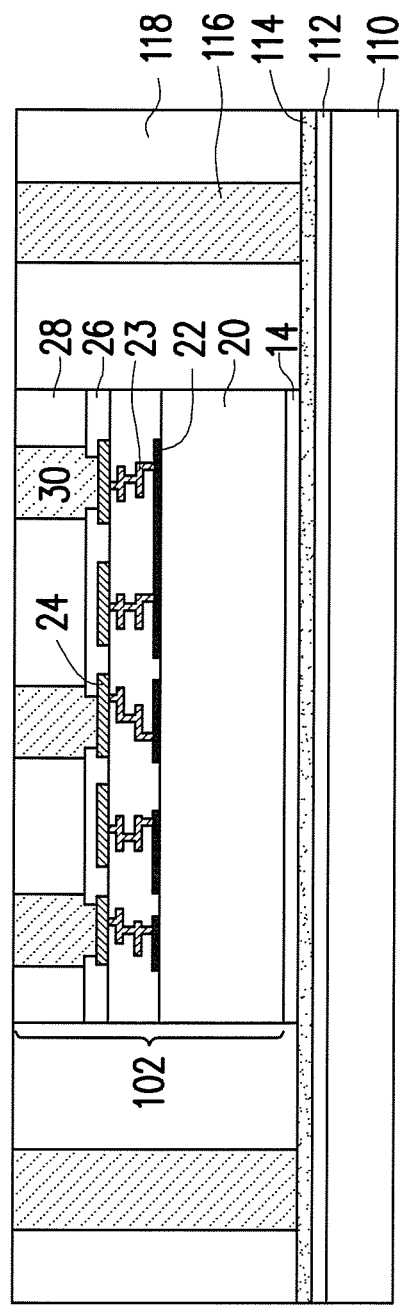
FIG. 1A through FIG. 1F are schematic views showing a manufacturing method of semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "below," "lower," "above," "upper" and the like, may be used herein for ease of description to describe one element or feature's relationship to another element(s) or feature(s) as illustrated in the FIGURES. The spatially relative terms are intended to encompass different orientations of the device in use or operation in addition to the orientation depicted in the FIGURES. The apparatus may be otherwise oriented (rotated 90 degrees or at other orientations) and the spatially relative descriptors used herein may likewise be interpreted accordingly.

FIG. 1A through FIG. 1F are schematic views showing a manufacturing method of semiconductor device in accordance with some embodiments.

Referring to FIG. 1A, in some embodiments, a die 102 is provided, for example. In some embodiments, the die 31 includes a substrate 20, an integrated circuit device 22, an interconnect structure 23, a pad 24, a first passivation layer 26, a connector 30 and a second passivation layer 28. The substrate 20 includes, for example, bulk silicon, doped or undoped, or an active layer of a silicon-on-insulator (SOI) substrate.

The integrated circuit device 22 is, for example, transistors, capacitors, resistors, diodes, photodiodes, fuse elements, or similar elements. The interconnect structure 23 is formed over the integrated circuit device 22 for connecting different integrated circuit device 22 to form a functional circuit. In some embodiments, the integrated circuit device 22 includes, for example, a gate structure in a dielectric layer, source/drain regions, and isolation structures, where the isolation structures may be shallow trench isolation (STI) structures. In some embodiments, the gate structure includes, for example, a gate electrode and a gate dielectric layer between the gate electrode and the substrate 20. In alternative embodiments, the gate structure may further include spacers (not shown) aside the gate electrode, for example. In some embodiments, a material of the gate electrode is, for example, polysilicon.

In some embodiments, the integrated circuit device 22 may be a one-time-programmable (OTP) memory, a dynamic random access memory (DRAM), a static random access memory (SRAM), a non-volatile random access memory (NVRAM), or a logic circuit, for example. In some embodiments, the integrated circuit device 22 may be fabricated using a bipolar-CMOS-DMOS (BCD) process.

The pad 24 is formed over or on the interconnect structure 23. The pad 24 and the interconnect structure 23 are electrically connected (not shown) to provide an external connection to the integrated circuit device 22. The pad 24 includes, for example, aluminum, copper, nickel, a combination of the foregoing, or the like.

The first passivation layer 26 is formed over the substrate 20 and the pad 24. The first passivation layer 26 includes a polymer such as polybenzoxazole (PBO), polyimide, benzocyclobutene (BCB), a combination thereof or the like. The first passivation layer 26 is formed by suitable fabrication techniques such as spin-coating, lamination, deposition or the like.

The connector 30 is formed over and selectively electrically connected to the pad 24. The connector 30 includes a solder bump, a gold bump, a copper bump, a copper post or a conductive post made of copper or copper alloys.

The second passivation layer 28 is formed over the first passivation layer 26 and aside the connector 30. The second passivation layer 28 includes, for example, a polymer. The polymer includes polybenzoxazole (PBO), polyimide, benzocyclobutene (BCB), a combination thereof or the like. The second passivation layer 28 is by suitable fabrication techniques such as spin-coating, lamination, deposition or the like.

In some embodiments, an adhesive layer 14 is formed over the back sides of the die 102. The adhesive layer 108 includes a die attach film (DAF), silver paste, or the like.

In some embodiments, the die 102 with the adhesive layer 14 is placed over a carrier 110. The carrier 110 is provided with a glue layer 112 and a dielectric layer 114 formed thereon. The carrier 110 may be a blank glass carrier, a blank ceramic carrier, or the like. The glue layer 112 may be formed of an adhesive such as an Ultra-Violet (UV) glue, a Light-to-Heat Conversion (LTHC) glue, or the like, although other types of adhesives may be used. In some embodiments, the glue layer 112 is decomposable under the heat of light to thereby release the carrier 110 from the structure formed thereon. The dielectric layer 114 is formed over the glue layer 112. In some embodiments, the dielectric layer 114 is a polymer layer. The polymer includes, for example, polyimide, PBO, BCB, Ajinomoto Buildup Film (ABF), Solder Resist film (SR), or the like. The dielectric layer 114 is formed by suitable fabrication techniques such as spin-coating, lamination, deposition or the like.

In some embodiments, a through via 116 is fondled over the carrier 110 aside the die 102. A material of the through via 116 may include metal such as copper, nickel, solder or combinations thereof. In alternative embodiments, the through via 116 includes a barrier layer (not shown), such as a Ti, TiN, Ta, TaN layer at a sidewall of the through via 116. An encapsulant 118 is formed over the carrier 110 to encapsulate the die 102. The encapsulant 118 encapsulates the die 102 to protect the die 102 from the environment and external contaminants. A material of the encapsulant 118 may include molding compound materials including resin and filler, a photo-sensitive material such as polybenzoxazole (PBO), polyimide, benzocyclobutene (BCB), any combination thereof and/or the like. In alternative embodiments, the encapsulant 118 may be formed of a nitride such as silicon nitride, an oxide such as silicon oxide, phosphosilicate glass (PSG), borosilicate glass (BSG), boron-doped phosphosilicate glass (BPSG), any combination thereof and/or the like.

Figure 1B:
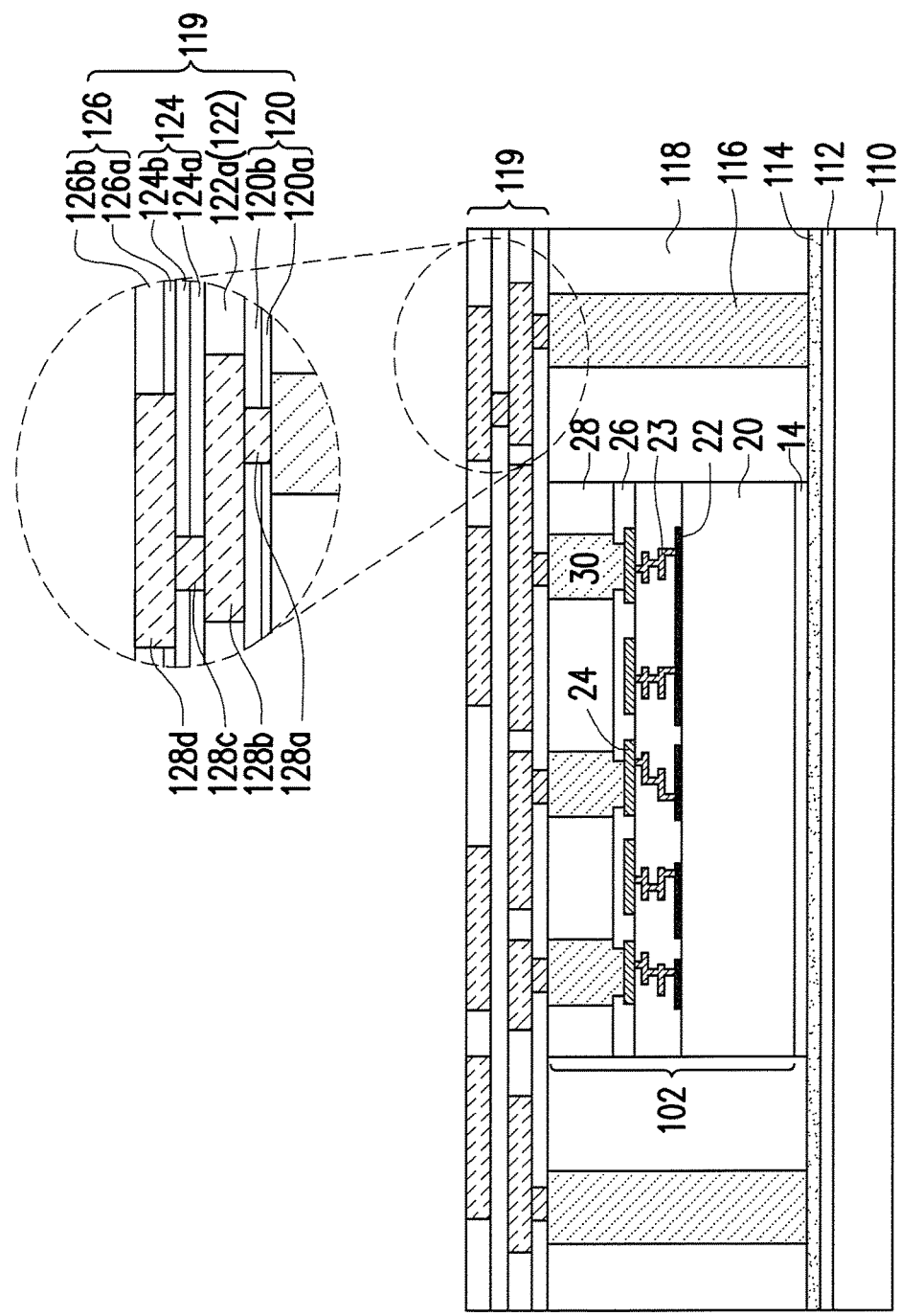

Referring to FIG. 1B, a conductive structure 119 is formed over the die 102 and electrically connected to the die 102. In some embodiments, the conductive structure 119 is formed over the die 102, the encapsulant 118 and the through via 116. In some embodiments, the conductive structure 119 is electrically connected with the connector 30, and/or the through via 16. The conductive structure 119 includes, for example, a plurality of dielectric layers 120 to 126 and a plurality of conductive features 128a to 128d in the dielectric layers 120 to 126. In some embodiments, the conductive structure 119 may be formed in a back-end-of-line (BEOL) process, for example. In some embodiments, each of the conductive features 128a to 128d may include a plug or a conductive line. In alternative embodiments, the conductive features 128a to 128d are copper-containing conductive materials. In alternative embodiments, the conductive features 128a to 128d include copper, nickel, gold, silver, aluminum, tungsten, a combination of the foregoing, or the like. The method of forming the conductive features 128a to 128d includes performing an electro-chemical plating process, chemical vapor deposition (CVD), plasma enhanced chemical vapor deposition (PECVD), physical vapor deposition (PVD), atomic layer deposition (ALD), a combination of the foregoing, or the like. In some embodiments, the method of forming the conductive structure 119 includes patterning a dielectric layer, forming a plug in the dielectric layer and a metal layer in the dielectric layer, and repeating the foregoing steps. The said embodiments in which the dielectric layer 120 to 126 has a single layer or bilayer are provided for illustration purposes, and are not constructed as limiting the present disclosure. It is appreciated by people having ordinary skill in the art that the number of the layer is not limited by the embodiments herein. Similarly, the said embodiments in which the conductive structure 119 has four dielectric layers and four conductive features are provided for illustration purposes, and are not constructed as limiting the present disclosure. It is appreciated by people having ordinary skill in the art that the number of the dielectric layer and the conductive feature is not limited by the embodiments herein.

In some embodiments, each of the dielectric layers 120 to 126 includes one or multiple layers. In some embodiments, the dielectric layer 122 includes one layer 122a, and the dielectric layer 120, 124 or 126 includes multiple layers 120a to 120c, 124a to 124b, or 126a to 126b. In some embodiments, in the dielectric layer 120, 124 or 126, materials of the layers 120a to 120c, 124a to 124b, or 126a to 126b are the same or different. In some embodiments, each of the dielectric layers 120 to 126 (e.g. each of layers 120a to 120c, 122a, 124a to 124b, or 126a to 126b) includes, for example, silicon oxide ($SiO_2$), silicon nitride ($SiN_x$), silicon carbide (SiC), a low dielectric constant (low-k) material, etc. The dielectric layers 120 to 126 are formed by deposition, spin-coating or lamination, for example.

In some embodiments, at least one of the dielectric layers 120 to 126 includes a compressive nitride-based layer with a refractive index of about 2.16 to 2.18. More specifically, at least one of the layers 120a to 120c, 122a, 124a to 124b, or 126a includes the compressive nitride-based layer with a refractive index of about 2.16 to 2.18. In some embodiments, the dielectric layer 126 aside the uppermost conductive features 128d has the compressive nitride-based layer, for example. In some embodiments, a material of the compressive nitride-based layer includes silicon nitride. In some embodiments, in the dielectric layer 126, the layer 126a is the compressive silicon nitride layer, and the layer 126b is silicon oxide layer, for example. In some embodiments, the compressive nitride-based layer serves as an etching stop layer while having a high ultraviolet transmittance. In some embodiments, the refractive index of the compressive nitride-based layer is about 2.16, 2.165, 2.17, 2.175, 2.18, including any range between any two of the preceding values. In some embodiments, the compressive nitride-based layer has a compressive stress less than $-2\times10^9$. In some embodiments, the compressive nitride-based layer has a low ratio of Si—H bond. In some embodiments, a ratio of Si—H bonds to N—H bonds in the compressive nitride-based layer ranges from about 0.25 to 0.5, for example. In some embodiments, the ratio of Si—H bonds to N—H bonds in the compressive nitride-based layer is about 0.25, 0.3, 0.35, 0.4, 0.45, 0.5, including any range between any two of the preceding values. In some embodiments, the compressive nitride-based layer has an ultraviolet transmittance of about 60% to 80% at 245 nm, for example. In some embodiments, the ultraviolet transmittance of the compressive nitride-based layer is about 60%, 65%, 70%, 75%, 80% at 245 nm, including any range between any two of the preceding values. In addition, the compressive nitride-based layer has a desired acid resistance, for example. In some embodiments, the compressive nitride-based layer is deposited with a radio frequency (RF) larger than 700 watts. In some embodiments, the RF is about 700 watts to 900 watts. In some embodiments, the compressive nitride-based layer is deposited by, for example, a PECVD using reactants of $SiH_4$ and $NH_3$ and a carrier gas of $N_2$. In some embodiments, a ratio of $SiH_4$ to $NH_3$ is, for example, less than 0.08. The deposition is, for example, performed at a temperature of about 400° C., a pressure of about 2 Torr to 3 Torr. The high RF larger than 700 watts causes the nitride-based layer being a compressive layer.

Figure 1C:
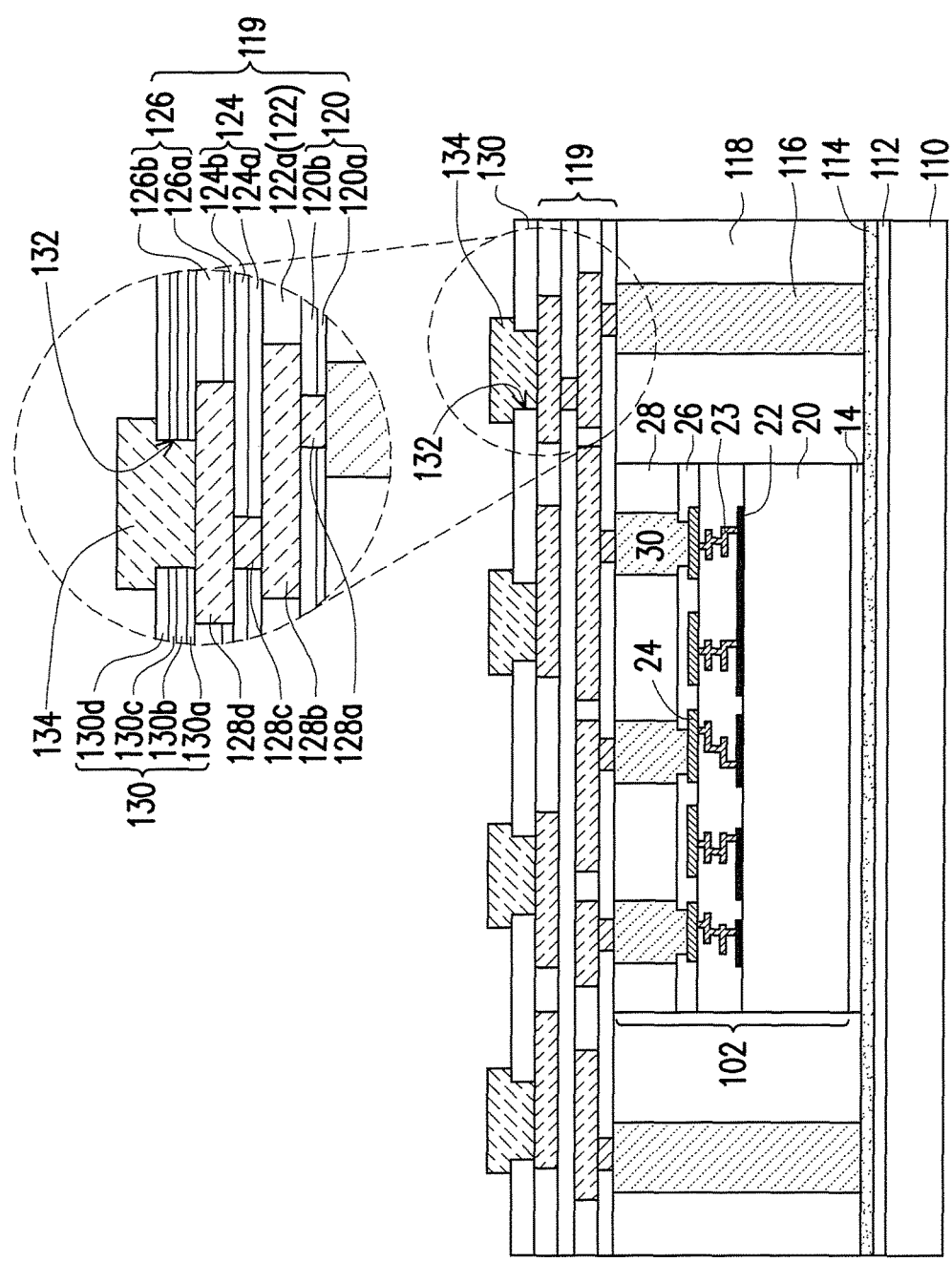

Referring to FIG. 1C, a bonding pad 134 is formed over the conductive structure 119 and electrically connected to the conductive structure 119. In some embodiments, a dielectric layer 130 is formed over the conductive structure 119, and then the bonding pad 134 is formed in an opening 132 of the dielectric layer 130 and over a portion of the dielectric layer 130. In some embodiments, the dielectric layer 130 has a multilayer structure, for example, and the dielectric layer 130 includes multiple layers 130a to 130d. In some embodiments, materials of the layers 130a to 130d are the same or different. In some embodiments, each of layers 130a to 130d includes, for example, silicon oxide ($SiO_2$), silicon nitride ($SiN_x$), silicon carbide (SiC), a low dielectric constant (low-k) material, etc. In alternative embodiments, the dielectric layer 130 has a single layer structure. The dielectric layer 130 is formed by deposition, spin-coating or lamination, for example. In some embodiments, the dielectric layer 130 includes a compressive nitride-based layer with a refractive index of about 2.16 to 2.18. More specifically, at least one of the layers 130a to 130d includes the compressive nitride-based layer with a refractive index of about 2.16 to 2.18. In some embodiments, the layers 130a and 130c are the compressive nitride-based layers such as compressive silicon nitride layers, and the layers 130b and 130d are silicon oxide layers, for example. In some embodiments, the compressive nitride-based layer serves as an etching stop layer while having a high ultraviolet transmittance. The forming method and properties of the compressive nitride-based layer are described above, and thus it is omitted here. The said embodiments in which a dielectric layer 130 has a four layered structure are provided for illustration purposes, and are not constructed as limiting the present disclosure. It is appreciated by people having ordinary skill in the art that the number of the dielectric layer is not limited by the embodiments herein.

In some embodiments, the bonding pad 134 includes aluminum or aluminum-containing conductive material. In alternative embodiments, the bonding pad 134 includes copper, nickel, gold, silver, tungsten, a combination of the foregoing, or the like. In some embodiments, the method of forming the bonding pad 134 includes performing an electro-chemical plating process, chemical vapor deposition (CVD), plasma enhanced chemical vapor deposition (PECVD), physical vapor deposition (PVD), atomic layer deposition (ALD), a combination of the foregoing, or the like to form a conductive layer and patterning the conductive layer.

Figure 1D:
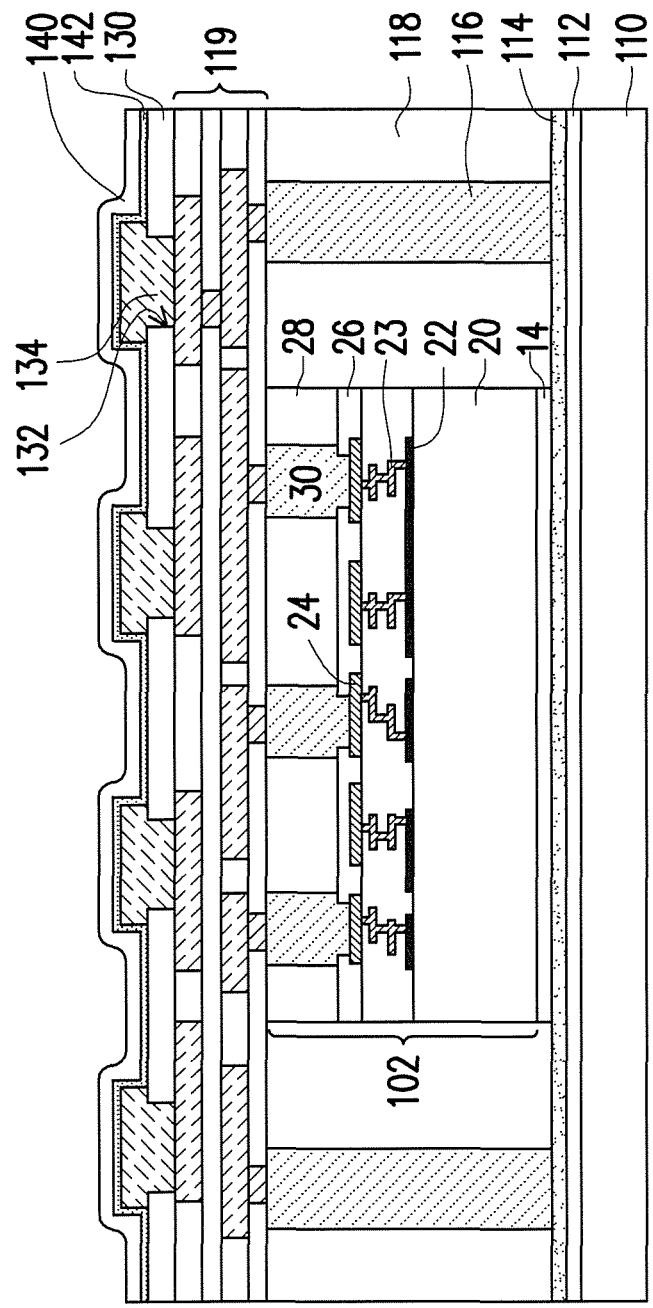

Referring to FIG. 1D, a passivation layer 140 is formed over the bonding pad 134. The passivation layer 140 includes one or multiple layers of suitable dielectric materials. The passivation layer 140 is formed by spin-coating, lamination or deposition, for example. In some embodiments, the passivation layer 140 has a multilayer structure. In alternative embodiments, the passivation layer 140 has a single layer structure. In some embodiments, the passivation layer 140 has a thickness of about 6,000 to 8,000 angstroms, for example. In some embodiments, the thickness of the passivation layer 140 is about 6000, 6500, 7000, 7500, 8000 angstroms, including any range between any two of the preceding values. In some embodiments, the passivation layer 140 is a conformal layer. The passivation layer 140 can be formed by disposing a passivation material layer over the bonding pad 134 conformally.

In some embodiments, the passivation layer 140 includes a compressive nitride-based layer with a refractive index of about 2.16 to 2.18. In some embodiments, the passivation layer 140 has a multilayer structure, and each layer of the passivation layer 140 is the compressive nitride-based layer. In some embodiments, the compressive nitride-based layer has a good acid resistance to provide protection for the bonding pad 134 while having a high ultraviolet transmittance. The forming method and properties of the compressive nitride-based layer are described above, and thus it is omitted here. In alternative embodiments, the material of the passivation layer 140 includes a polymer, such as polyimide, a solder resist, polybenzoxazole (PBO), benzocyclobutene (BCB), a combination of the foregoing, or the like.

In some embodiments, a dielectric layer 142 is further formed between the bonding pad 134 and the passivation layer 140. In some embodiments, the dielectric layer 142 improves the adhesion between the passivation layer 140 and the bonding pad 134, for example. In some embodiments, the dielectric layer 142 is formed over the bonding pad 134, and then the passivation layer 140 is formed over the dielectric layer 142. The dielectric layer 142 has a single layer structure or a multilayer structure. In some embodiments, a material of the dielectric layer 142 is different from the material of the passivation layer 140. In some embodiments, the dielectric layer 142 includes an inorganic dielectric material such as an oxide or a nitrogen-containing dielectric material. In some embodiments, the inorganic dielectric material includes silicon oxide, silicon oxynitride, a combination of the foregoing, or the like. In some embodiments, a forming method of the dielectric layer 142 includes performing a CVD or PECVD process, for example. In some embodiments, the dielectric layer 142 is a conformal layer. More specifically, the dielectric layer 142 is formed by disposing a dielectric material layer over the bonding pad 134 conformally. In an exemplary embodiment, the thickness of the dielectric layer 142 is in a range of 200 angstroms to 500 angstroms.

In some embodiments, generally, after forming the passivation layer 140 over the bonding pad 134, a pin hole test is performed on the resulting structure as shown in FIG. 1D. In some embodiments, the pin hole test is performed with acid solution under heat, to ensure the passivation layer 140 provides protection for the bonding pad 134 from being corroded by the acid solution. In some embodiment, since the passivation layer 140 includes a compressive nitride-based layer, the passivation layer 140 has a good acid resistance and thus protects the bonding pad 134 from being corroded by the acid solution. Accordingly, the semiconductor device passes the pin hole test. That is, the bonding pad 134 and the semiconductor device have a good reliability. On the other hand, in a conventional semiconductor device, a tensile passivation layer serving a passivation layer and over the bonding pad may have cracks. Therefore, in the pin hole test, the underlying bonding pad, especially a bottom corner of the bonding pad, is corroded by acid solution through the cracks in the passivation layer. In other words, the tensile passivation layer provides weak protection for the bonding pad and thus reliability of the semiconductor device is lowered.

Figure 1E:
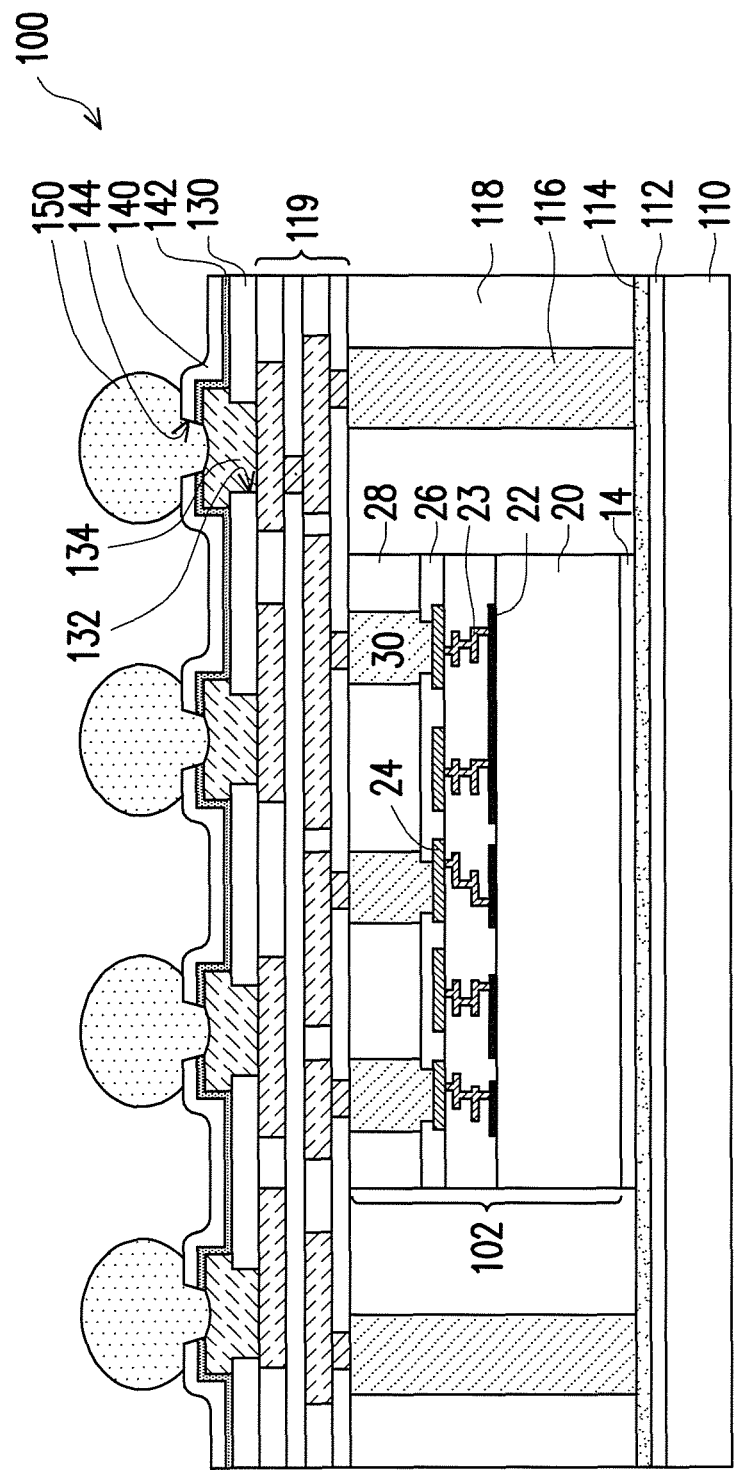

Referring to FIG. 1E, the passivation layer 140 and the dielectric layer 142 are patterned to form an opening 144 therethrough and exposing a portion of the bonding pad 134. In some embodiments, the opening 144 is formed by, for example, an etching process such as a wet etching process or a dry etching process.

In some embodiments, a connector 150 is formed in the opening 144 to electrically connect to the bonding pad 134. The connector 150 is a conductive bump, for example. The conductive bump is a ball, a post, or the like, for example. The conductive bump drops into the corresponding position in ball grid array (BGA) packaging, for example. A material of the connector 150 includes a lead-free alloy (e.g. gold or a Sn/Ag/Cu alloy), a leaded alloy (e.g. a Pb/Sn alloy), copper, aluminum, aluminum copper, other bump metal materials, and/or a combination of the foregoing, for example. The semiconductor device 100 of the present disclosure is thus completed.

Figure 1F:
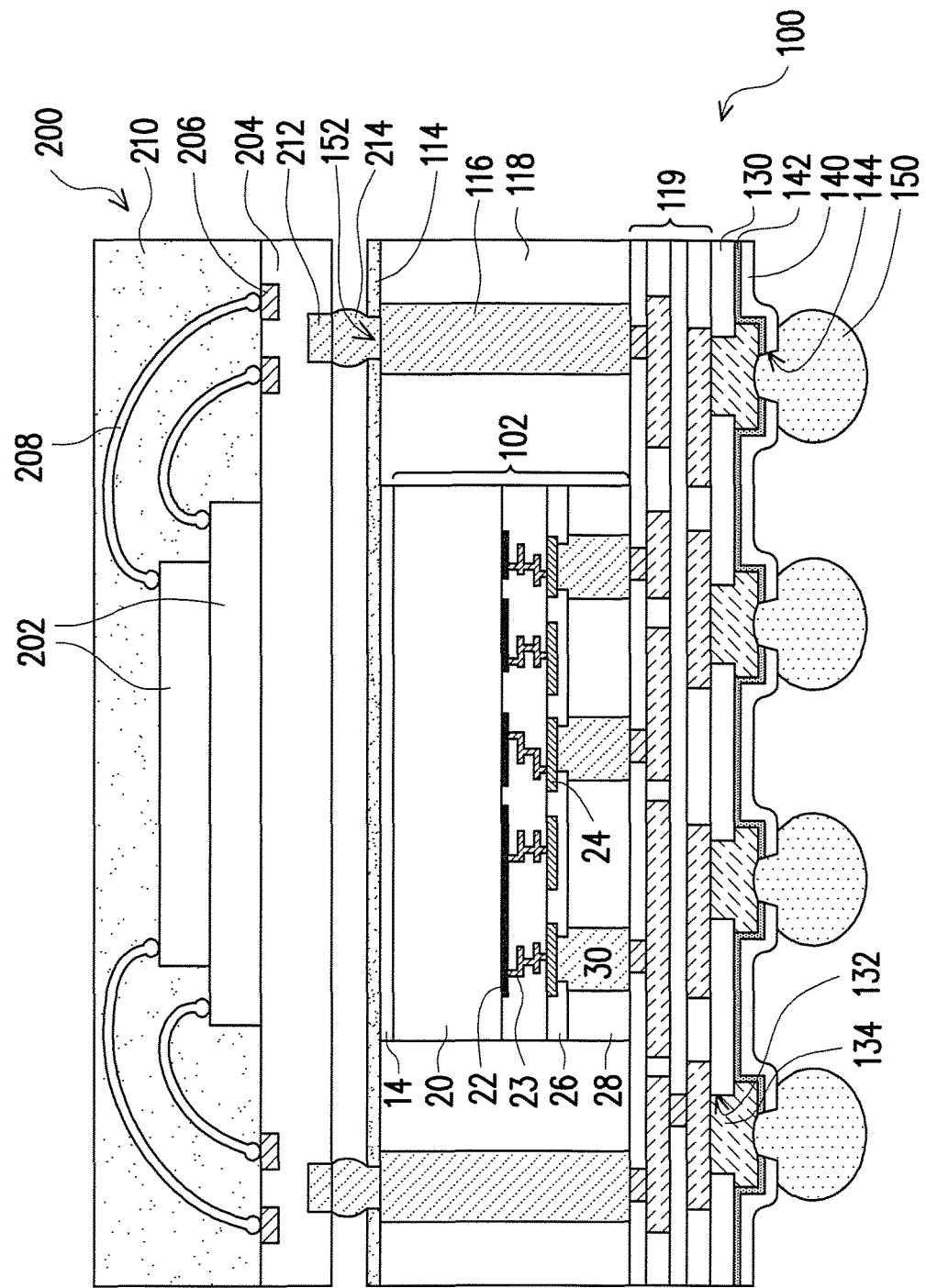

Referring to FIG. 1F, in some embodiments, the glue layer 112 is decomposed under the heat of light, and the carrier 110 is then released from the semiconductor device 100. Thereafter, the semiconductor device 100 is turned over. An opening 152 is formed in the dielectric layer 114 by a laser drilling process, for example. The semiconductor device 100 is further electrically coupled to a semiconductor device 200; a stacking structure such as a PoP device is thereby obtained.

In some embodiments, the semiconductor device 200 has a substrate 204, and a die 202 is mounted on one surface (e.g. top surface) of the substrate 204. Bonding wires 208 are used to provide electrical connections between the die 202 and pads 206 (such as bonding pads) on the same top surface of the substrate 204. A through via (not shown) may be used to provide electrical connections between the pad 206 and pad 212 (such as bonding pad) on an opposing surface (e.g. bottom surface) of the substrate 204. Connectors 214 connect the pads 212 and fill in the openings 152 to electrically connect to the through via 116 of the semiconductor device 100. An encapsulant 210 is formed over the components to protect the components from the environment and external contaminants.

In some embodiments, at least one of the passivation layer 140, the dielectric layers 120 to 126 of the conductive structure 119 and the dielectric layer 130 aside the bonding pad 134 includes the compressive nitride-based layer with a high ultraviolet transmittance and a good acid resistance. In some embodiments, the passivation layer 140 including the compressive nitride-based layer protects the bonding pad 134 from being corroded, and thus the bonding pad 134 has good electrical characteristics. Accordingly, the semiconductor device 100 including the passivation layer 140 and the bonding pad 134 and the stacking structure of the semiconductor device 100 and the semiconductor device 200 have a good reliability. Moreover, in some embodiments, the passivation layer 140 and/or the dielectric layers 120 to 126 and 130 including the compressive nitride-based layer has a high ultraviolet transmittance, and thus the semiconductor device 100 is capable of being a device requiring one-time-programmable (OTP) function such as a power control chip using bipolar-CMOS-DMOS (BCD) technology or a touch chip using high voltage technology.

In some embodiments, by applying a radio frequency (RF) larger than 700 watts and lowering Si—H bond ratio in a nitride-based layer, the formed nitride-based layer is a compressive layer. Compared with a tensile nitride-based layer such as a tensile silicon nitride layer, a compressive nitride-based layer such as a compressive silicon nitride layer has a good acid resistance, a high ultraviolet transmittance, and a good adhesion during wafer bending. Thus, in some embodiments, using the compressive nitride-based layer as the passivation layer overlying the bonding pad, the passivation layer protects the bonding pad from being corroded by the acid solution during the pin hole test. Furthermore, in some embodiments, using the compressive nitride-based layer as a passivation layer and/or a dielectric layer in the semiconductor device such as the one-time-programmable-based device, ultraviolet rays may pass through the passivation layer and/or the dielectric layer, and data can be erased efficiently. Accordingly, electrical characteristics of the semiconductor device and the stacking structure of the semiconductor device and another semiconductor device are improved, and the reliability of the semiconductor device and the stacking structure of the semiconductor device and another semiconductor device are optimized.

A semiconductor device includes a die, a conductive structure, a bonding pad and a passivation layer. The conductive structure is over and electrically connected to the die. The bonding pad is over and electrically connected to the conductive structure. The passivation layer is over the bonding pad, wherein the passivation layer includes a nitride-based layer with a refractive index of about 2.16 to 2.18.

A semiconductor device includes a die and a conductive structure. The conductive structure is over and electrically connected to the die. The conductive structure includes a plurality of dielectric layers and a plurality of conductive features in the dielectric layers, wherein at least one dielectric layer includes a nitride-based layer with a refractive index of about 2.16 to 2.18.

A manufacturing method of a semiconductor device includes the following. A conductive structure is formed over a die. A bonding pad is formed over the conductive structure. A passivation layer is formed over the bonding pad with a radio frequency (RF) larger than 700 watts, wherein the passivation layer includes a nitride-based layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a die;
   a conductive structure over and electrically connected to the die;
   a bonding pad, over and electrically connected to the conductive structure; and
   a passivation layer, over the bonding pad, wherein the passivation layer comprises a nitride-based layer with a refractive index of about 2.16 to 2.18.

2. The semiconductor device according to claim 1, wherein a material of the nitride-based layer comprises silicon nitride.

3. The semiconductor device according to claim 1, wherein the nitride-based layer has an ultraviolet transmittance of about 60% to 80% at 245 nm.

4. The semiconductor device according to claim 1, wherein the nitride-based layer is a compressive layer.

5. The semiconductor device according to claim 1, further comprising a dielectric layer between the passivation layer and the bonding pad.

6. The semiconductor device according to claim 5, wherein a material of the dielectric layer comprises silicon oxide.

7. The semiconductor device according to claim 5, wherein the bonding pad is exposed through an opening in the passivation layer and the dielectric layer.

8. The semiconductor device according to claim 1, wherein a material of the bonding pad comprises aluminum or aluminum-containing conductive material.

9. A semiconductor device, comprising:
   a die; and
   a conductive structure, over and electrically connected to the die, comprising a plurality of dielectric layers and a plurality of conductive features in the dielectric layers, wherein at least one dielectric layer comprises a nitride-based layer with a refractive index of about 2.16 to 2.18.

10. The semiconductor device according to claim 9, wherein a material of the nitride-based layer comprises silicon nitride.

11. The semiconductor device according to claim 9, wherein the nitride-based layer is a compressive layer.

12. The semiconductor device according to claim 9, wherein the nitride-based layer has an ultraviolet transmittance of about 60% to 80% at 245 nm.

13. The semiconductor device according to claim 9, wherein the nitride-based layer serves as an etching stop layer.

14. A manufacturing method of a semiconductor device, comprising:
  forming a conductive structure over a die;
  forming a bonding pad over the conductive structure; and
  forming a passivation layer over the bonding pad with a radio frequency (RF) larger than 700 watts, wherein the passivation layer comprises a nitride-based layer.

15. The manufacturing method according to claim 14, wherein the passivation layer is formed by a plasma enhanced chemical vapor deposition (PECVD).

16. The manufacturing method according to claim 14, further comprising forming a dielectric layer between the passivation layer and the bonding pad.

17. The manufacturing method according to claim 16, further comprising forming an opening in the passivation layer and the dielectric layer to expose a portion of the bonding pad.

18. The manufacturing method according to claim 14, wherein the passivation layer is deposited using reactants of $SiH_4$ and $NH_3$.

19. The manufacturing method according to claim 18, wherein a ratio of $SiH_4$ to $NH_3$ is less than 0.08.

20. The manufacturing method according to claim 14, wherein the nitride-based layer is a compressive layer.

* * * * *